United States Patent
Mao et al.

(10) Patent No.: US 6,709,975 B2
(45) Date of Patent: Mar. 23, 2004

(54) METHOD OF FORMING INTER-METAL DIELECTRIC

(75) Inventors: Hui Min Mao, Tainan Hsien (TW); Yi-Nan Chen, Taipei (TW); Tzu-Ching Tsai, Taichung Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/222,349

(22) Filed: Aug. 16, 2002

(65) Prior Publication Data

US 2003/0199138 A1 Oct. 23, 2003

(30) Foreign Application Priority Data

Apr. 15, 2002 (TW) .................................. 91107641 A

(51) Int. Cl.$^7$ .......................................... H01L 21/4763
(52) U.S. Cl. ...................... 438/637; 438/638; 438/639; 438/672
(58) Field of Search .................................. 438/637–639, 438/672–675

(56) References Cited

U.S. PATENT DOCUMENTS 5,681,425 A * 10/1997 Chen ........................... 438/631
6,410,424 B1 * 6/2002 Tsai et al. .................... 438/637

* cited by examiner

*Primary Examiner*—Dung Le
(74) *Attorney, Agent, or Firm*—Ladas & Parry

(57) ABSTRACT

A method of forming inter-metal dielectric (IMD). A substrate having a patterned metal layer thereon has at least one opening to expose the substrate. The opening has an aspect ratio of 3.5~4.5. Next, the opening is filled with a first dielectric layer, and voids are formed in the upper portion of the first dielectric layer due to the high aspect ratio opening. Thereafter, the first dielectric layer is etched to leave the first dielectric layer with a predetermined height in the opening without voids. Finally, a second dielectric layer is formed on the first dielectric layer to completely fill the opening.

20 Claims, 2 Drawing Sheets

METHOD OF FORMING INTER-METAL DIELECTRIC

BACKGROUND OF THE INVENTION

1. Field of the Invention

The present invention relates in general to a semiconductor technology. More particularly, it relates to a method of forming inter-metal dielectric (IMD) to prevent voids or seams formed in the dielectric.

2. Description of the Related Art

Conductive materials, semiconductors, and insulating materials are widely applied in the integrated circuit (IC) industry, and the main technology for IC industry includes thin film deposition, photolithography, and etching. Thin film deposition deposits the materials as mentioned above onto a wafer to be fabricated. Photolithography reproduces desired device or circuit patterns in the photoresist layer over the thin films. Etching transfers the device or circuit patterns onto the thin films through the patterned photoresist layer, to form devices such as transistors or capacitors on the wafer.

After the devices or circuits are finished, metal wires connecting each device or circuit must be formed, referred to as metallization. In metallization, a nonconductive layer of dielectric material, such as silicon dioxide is often formed between the metal wires or devices. This dielectric layer may protect metal wires from physical or chemical damage, insulate metal wire from other wires, and insulate devices. Typically, this dielectric layer is called inter-layer dielectric (ILD) and inter-metal dielectric.

As semiconductor device geometries continue to decrease in size to provide more devices per fabricated wafer and faster devices, line width of the metal wires for connecting each device and the spacing between the metal wires has been reduced. However, as the spacing or gaps between these metal wires decrease, it becomes more difficult to fill the gap with the dielectric material because of increasing the aspect ratio of the gap.

Accordingly, the gap cannot be filled fully with the dielectric material by physical vapor deposition (PVD) or chemical vapor deposition (CVD). Particularly, as the aspect ratio of the gap exceeds 3.5, voids or seams are formed in the gap during dielectric filling. As a result, the reliability of the devices is reduced.

SUMMARY OF THE INVENTION

Accordingly, an object of the invention is to provide a method of forming inter-metal dielectric to avoid voids or seams in the dielectric in the gap by reducing the aspect ratio of the gap through a double dielectric filling process.

To achieve these and other advantages, the invention provides a method of forming inter-metal dielectric. First, a substrate having a patterned metal layer thereon is provided, in which the patterned metal layer has at least one opening to expose the substrate. The opening has an aspect ratio of 3.5~4.5. Next, a conformable protective layer is formed over the patterned metal layer and the opening. Next, the opening is filled with a first dielectric layer, and voids are formed in the upper portion of the first dielectric layer due to the high aspect ratio opening. Thereafter, the first dielectric layer is etched to leave the first dielectric layer with a predetermined height in the opening without voids therein. Finally, a second dielectric layer is formed on the first dielectric layer to completely fill the opening.

The patterned metal layer is aluminum, the protective layer is silicon nitride, and the first and the second dielectric layer are high density plasma oxide. Moreover, the predetermined height is 1000~1400 Å.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the present invention is now described with reference to FIGS. 1–4.

Figure 1:
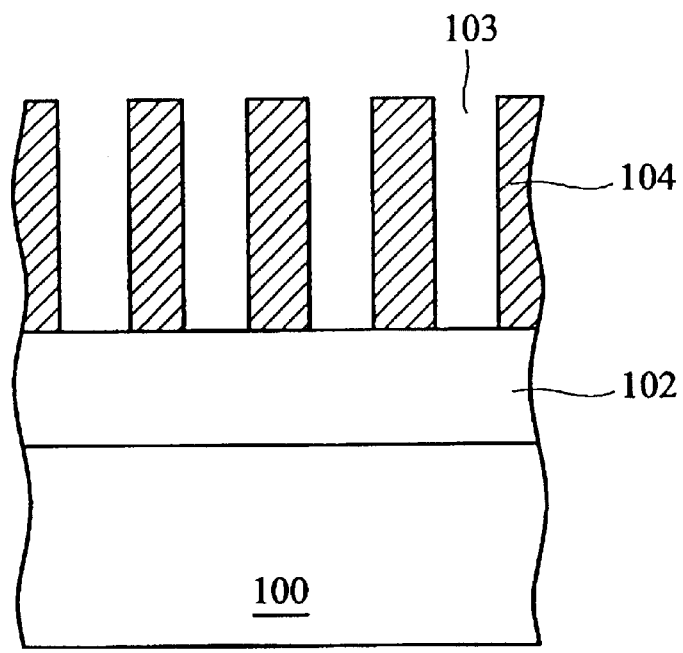
FIGS. 1–4 are cross-sections showing a method of forming inter-metal dielectric according to the present invention.

First, in FIG. 1, a substrate 100, such as silicon wafer, has semiconductor devices thereon. In this invention, a dielectric layer 102, such as silicon dioxide, can be formed on the substrate 100 to serve as an ILD. Subsequently, a metal layer (not shown), such as aluminum, is formed over the dielectric layer 102 by conventional deposition.

Next, the metal layer is etched using a patterned oxide layer (not shown) as a hard mask to form a patterned metal layer 104 with a plurality of openings 103 to expose dielectric layer 102. This patterned metal layer 104 serves as metal wire to connect semiconductor devices (not shown). In addition, these openings have an aspect ratio of 3.5~5.

Figure 2:
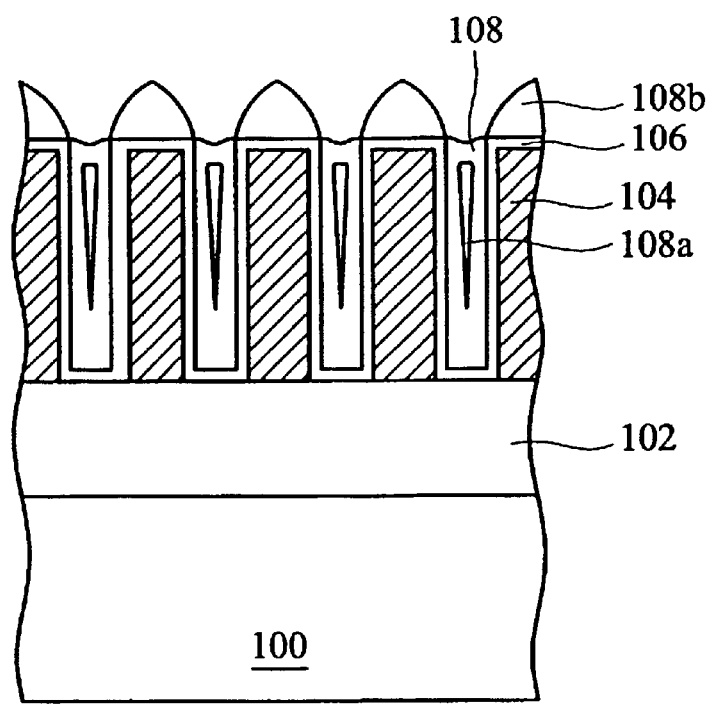

Next, in FIG. 2, a conformable protective layer 106 having a thickness about 100~200 Å is deposited over the patterned metal layer 104 and the openings 103. In this invention, the protective layer 106 can be a silicon nitride layer to serve as an etch stop layer for subsequent etching, and prevent the patterned metal layer 104 from damage because of etching.

Thereafter, a dielectric layer 108 is deposited over the patterned metal layer 104 covered by the protective layer 106 and filled into the openings 103 by conventional deposition. In this invention, the dielectric layer 108 can be an oxide layer and formed by high density plasma CVD (HDPCVD), to form an island-shaped dielectric 108b over the patterned metal layer 104. The dielectric layer 108 insulates metal lines from other lines. As mentioned above, these openings 103 have a higher aspect ratio, as the dielectric layer 108 is filled into the openings 103 by HDPCVD, voids 108a are formed in the upper portion of the dielectric layer 108.

Figure 3:
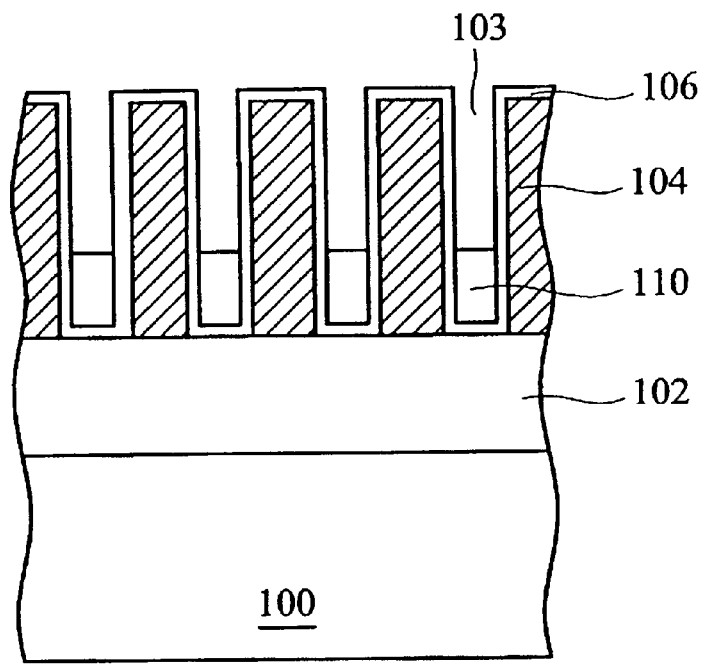

Next, in FIG. 3, the island-shaped dielectric 108b and the upper portion of the dielectric layer 108 containing voids 108a in the openings 103, are removed by spin etching using dilute hydrofluoric acid (DHF) as etchant to leave the lower portion of the dielectric layer 110 with a predetermined height. In this example of the invention, the width of the opening 103 (metal line spacing) is about 0.11 µm, and the depth of the opening 103 is about 3850~4950 Å.

Accordingly, the height of the remaining dielectric layer 110 is about 1000~1400 Å, to reduce the aspect ratio of the opening 103 lower than 3.5 and without voids 108a in the remaining dielectric layer 110.

Figure 4:
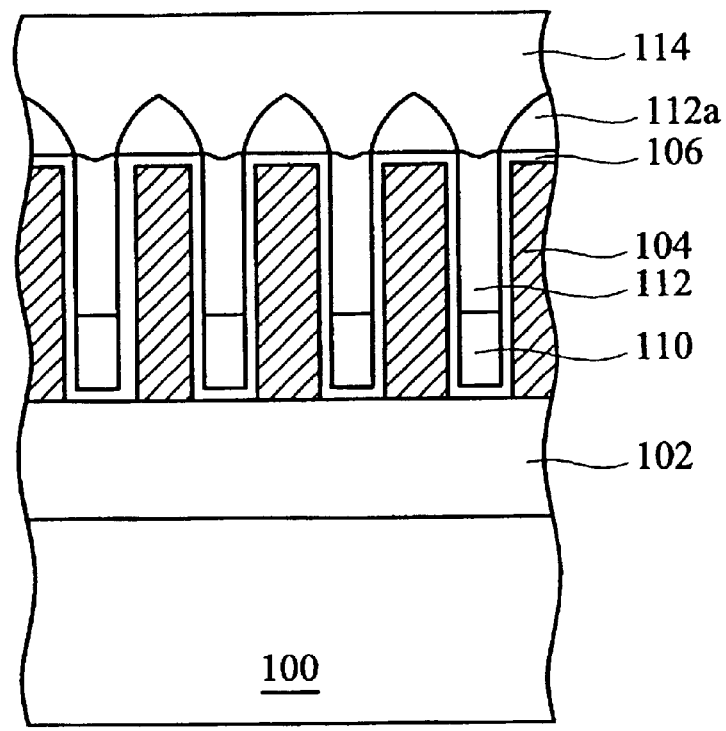

Finally, in FIG. 4, a dielectric layer 112 is deposited over the patterned metal layer 104 covered by a protective layer 106 and the remaining dielectric layer 110 to completely fill the openings 103.

Also, the dielectric layer 112 can be an oxide layer and formed by HDPCVD. Thus, the island-shaped dielectric 112a is also formed on the patterned metal layer 104 covered by a protective layer 106. Since the aspect ratio of the opening 103 with a remained dielectric layer 110 therein is lower than 3.5, the dielectric layer 112 can completely fill the openings 103 without voids or seams. That is, the reliability of the devices can be increased due to improved insulation between metal lines or devices. Next, a dielectric layer 114 having a thickness about 6000 Å, such as tetraethyl orthosilicate (TEOS) oxide, is formed over the patterned layer 104 and the dielectric layer 112 in the openings 103 by CVD. Thereafter, the dielectric layer 114 is planarized by CMP to finish the IMD.

Compared to the prior art, the invention effectively eliminates voids or seams in the IMD by reducing the aspect ratio of the gap or spacing through a doubling of the dielectric filling process. Therefore, higher reliability of the devices can be obtained through improved insulation between metal wires or devices.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming inter-metal dielectric, comprising the steps of:
   providing a substrate having a patterned metal layer with at least one opening to expose the substrate;
   filling the opening with a first dielectric layer;
   etching back the first dielectric layer to leave the first dielectric layer with a predetermined height only in the opening; and
   forming a second dielectric layer on the first dielectric layer to completely fill the opening.

2. The method as claimed in claim 1, further comprising a step of forming a conformable protective layer over the patterned metal layer and the opening.

3. The method as claimed in claim 2, wherein the protective layer is silicon nitride.

4. The method as claimed in claim 2, the protective layer having a thickness 100~200 Å.

5. The method as claimed in claim 1, wherein the patterned metal layer is aluminum.

6. The method as claimed in claim 1, wherein an aspect ratio of the opening is 3.5~4.5.

7. The method as claimed in claim 6, wherein the predetermined height is 1000~1400 Å.

8. The method as claimed in claim 1, wherein the first and the second dielectric layers are high density plasma oxide.

9. The method as claimed in claim 1, wherein the first dielectric layer is etched by spin etching.

10. The method as claimed in claim 9, wherein the spin etching uses dilute hydrofluoric acid (DHF) as etchant.

11. A method of forming inter-metal dielectric, comprising the steps of:
    providing a substrate covered by a first dielectric layer;
    forming an aluminum pattern on the first dielectric layer, the patterned aluminum layer having at least one opening to expose the first dielectric layer, and an aspect ratio of the opening is 3.5~4.5;
    forming a conformable protective layer over the aluminum pattern and the opening;
    filling the opening with a second dielectric layer;
    etching back the second dielectric layer to leave the second dielectric layer with a predetermined height in the opening; and
    forming a third dielectric layer on the second dielectric layer to completely fill the opening.

12. The method as claimed in claim 1, further comprising the steps of:
    forming a fourth dielectric layer over the patterned metal layer and the third dielectric layer; and
    planarizing the fourth dielectric layer.

13. The method as claimed in claim 12, wherein the fourth dielectric layer is tetraethyl orthosilicate (TEOS) oxide.

14. The method as claimed in claim 12, wherein the fourth dielectric layer is planarized by chemical mechanical polishing.

15. The method as claimed in claim 11, wherein the first dielectric layer is silicon oxide.

16. The method as claimed in claim 11, wherein the second and the third dielectric layers are high density plasma oxide.

17. The method as claimed in claim 11, wherein the second dielectric layer is etched by spin etching using dilute hydrofluoric acid (DHF) as etchant.

18. The method as claimed in claim 11, wherein the protective layer is silicon nitride.

19. The method as claimed in claim 11, the protective layer having a thickness 100~200 Å.

20. The method as claimed in claim 11, wherein the predetermined height is 1000~1400 Å.

* * * * *